US011428645B2

(12) United States Patent
Nam et al.

(10) Patent No.: US 11,428,645 B2
(45) Date of Patent: Aug. 30, 2022

(54) WAFER INSPECTION DEVICE AND METHOD OF MANUFACTURING SEMICONDUCTOR DEVICE BY USING THE WAFER INSPECTION DEVICE

(71) Applicant: Samsung Electronics Co., Ltd., Suwon-si (KR)

(72) Inventors: Kihak Nam, Daejeon (KR); Sungyoon Ryu, Seoul (KR); Kwangeun Kim, Hwaseong-si (KR); Hwiwoo Park, Incheon (KR); Dayoung Yoon, Incheon (KR); Myoungkyu Choi, Incheon (KR)

(73) Assignees: Samsung Electronics Co., Ltd., Gyeonggi-do (KR); Advanced Technology Inc., Incheon (KR)

( * ) Notice: Subject to any disclaimer, the term of this patent is extended or adjusted under 35 U.S.C. 154(b) by 121 days.

(21) Appl. No.: 17/026,494

(22) Filed: Sep. 21, 2020

(65) Prior Publication Data
US 2021/0247328 A1    Aug. 12, 2021

(30) Foreign Application Priority Data
Feb. 11, 2020    (KR) .................. 10-2020-0016634

(51) Int. Cl.
*G01N 21/95* (2006.01)
*H01L 21/687* (2006.01)
(Continued)

(52) U.S. Cl.
CPC ......... *G01N 21/9501* (2013.01); *G01N 21/55* (2013.01); *H01L 21/687* (2013.01); *G01N 2021/213* (2013.01)

(58) Field of Classification Search
CPC ............. G01N 21/9501; G01N 21/55; G01N 2021/213; G01N 21/8806; H01L 21/687;
(Continued)

(56) References Cited

U.S. PATENT DOCUMENTS 5,515,167 A    5/1996 Ledger et al.
6,376,329 B1    4/2002 Sogard et al.
(Continued)

FOREIGN PATENT DOCUMENTS

JP    H0917831 A  *  1/1997  ............. H01L 21/66
JP    2010-021460 A    1/2010
(Continued)

*Primary Examiner* — Roy M Punnoose
(74) *Attorney, Agent, or Firm* — Harness, Dickey & Pierce, P.L.C.

(57) ABSTRACT

According to embodiments, a wafer inspection device is provided. The wafer inspection device includes a porous chuck including a plurality of pores formed all over the porous chuck to allow pressure for fixing a wafer to be applied thereto, a chuck driving device, a back side inspection optical system configured to inspect a portion of a back surface of the wafer, and a position identification optical system, wherein the porous chuck includes a plurality of holes uniformly formed all over the porous chuck to partially expose the back surface of the wafer and a slit exposing the back surface of the wafer and extending in one direction parallel to a top surface of the porous chuck.

20 Claims, 13 Drawing Sheets

(51) Int. Cl.
*G01N 21/55* (2014.01)
*G01N 21/21* (2006.01)

(58) Field of Classification Search
CPC ............. H01L 21/67259; H01L 21/681; H01L 21/6838; H01L 22/12; H01L 21/78; H01L 22/30; H01L 21/68; H01L 21/68757; H01L 21/68764; H01L 21/68785
USPC ....................................................... 356/237.5
See application file for complete search history.

(56) References Cited

U.S. PATENT DOCUMENTS

| | | |
|---|---|---|
| 6,559,938 B1 | 5/2003 | Smedt |
| 7,585,684 B2 | 9/2009 | Park et al. |
| 7,615,116 B2 | 11/2009 | Kanaya et al. |
| 2017/0352575 A1* | 12/2017 | Gangakhedkar ............................ H01L 21/67017 |
| 2018/0144959 A1 | 5/2018 | Nemani et al. |
| 2019/0267276 A1* | 8/2019 | Stayt, Jr. ........... H01L 21/68735 |

FOREIGN PATENT DOCUMENTS

| | | |
|---|---|---|
| JP | 2012-234886 A | 11/2012 |
| KR | 10-2008-0092551 A | 10/2008 |

\* cited by examiner

WAFER INSPECTION DEVICE AND METHOD OF MANUFACTURING SEMICONDUCTOR DEVICE BY USING THE WAFER INSPECTION DEVICE

CROSS-REFERENCE TO RELATED APPLICATION

This application claims the benefit of Korean Patent Application No. 10-2020-0016634, filed on Feb. 11, 2020, in the Korean Intellectual Property Office, the disclosure of which is incorporated herein in its entirety by reference.

BACKGROUND

Inventive concepts relates to a wafer inspection device and/or a method of manufacturing a semiconductor device by using the wafer inspection device.

The semiconductors industry may be broadly categorized into the fabrication industry and the assembly industry. The fabrication industry includes a plurality of processes for processing a substrate such as a wafer, and for example, includes processes of manufacturing a wafer, oxidation processes of forming oxide layers on the wafer, lithography processes, thin film deposition processes, dry/wet etching processes, and metal wiring processes. At an end of the fabrication process, the substrate (wafer) may be output as part of a FAB-out process. The assembly industry includes processes of isolating a wafer, completed after FAB-out, into individual chips, and packaging the chips so as to protect the chips.

A thickness variation of a material layer, formed in a back surface of a wafer in a semiconductor manufacturing process, may cause a defect in a wafer sawing process based on a chip unit, causing a reduction in a yield rate. Therefore, the demand for measuring a reflectance/transmittance and a thickness of a back surface of a substrate/wafer is increasing.

SUMMARY

Inventive concepts provides a wafer inspection device having enhanced reliability and/or a method of manufacturing a semiconductor device by using the wafer inspection device.

According to some example embodiments, a wafer inspection device is provided. The wafer inspection device includes a porous chuck having a plurality of pores located all over the porous chuck the plurality of pores enabling pressure for fixing a wafer to be applied to the porous chuck, a chuck driving actuator configured to drive the porous chuck, a back side inspection optical system under the porous chuck, the back side inspection optical system configured to inspect a portion of a back surface of the wafer, and a position identification optical system on the porous chuck, the position identification optical system configured to identify a position of the portion of the wafer inspected by the back side inspection optical system. The porous chuck includes a plurality of holes uniformly located all over the porous chuck, the plurality of holes configured to partially expose the back surface of the wafer, and a slit configured to expose the back surface of the wafer and extending in one direction parallel to a top surface of the porous chuck.

According to some example embodiments, a wafer inspection device is provided. The wafer inspection device includes a chuck configured to fix a wafer by using vacuum pressure, a chuck driving actuator configured to drive the chuck, a back side inspection optical system under the chuck and configured to inspect a back surface of the wafer, and a position identification optical system on the chuck and configured to identify a position of a portion of the wafer inspected by the back side inspection optical system. The chuck includes a plurality of holes radially symmetrical with respect to a center of the chuck and configured to partially expose the back surface of the wafer, and a slit extending in one direction parallel to a top surface of the chuck, the slit crossing the center of the chuck and configured to expose the back surface of the wafer.

According to some example embodiments, a wafer inspection device is provided. The wafer inspection device includes a load port configured to load a cassette having a wafer in the cassette, a back side inspector hardware configured to inspect a back surface of the wafer; and an equipment front end hardware configured to transfer the wafer from the load port to the back side inspector hardware. The equipment front end hardware includes, a transfer robot configured to transfer the wafer, and a pre-aligner hardware configured to rotate and align the wafer. The back side inspector hardware includes, a chuck configured to support the wafer transferred from the cassette, the chuck including a porous material, a chuck driving actuator configured to drive the chuck, and a back side inspection optical system under the chuck, the back side inspection optical system configured to inspect the back surface of the wafer. The chuck includes, a plurality of holes uniformly formed all over the back surface of the chuck to partially expose the back surface of the wafer, and a first slit extending in one direction parallel to a top surface of the chuck to expose the back surface of the wafer.

According to some example embodiments, a method of manufacturing a semiconductor device is provided. The method includes aligning a wafer at a first angle, mounting the aligned wafer on a chuck, determining a thickness of a material layer, through a slit and through a plurality of holes passing through the chuck, the material layer formed at each of a plurality of different positions of a back surface of the wafer, and cutting the wafer based on the determined thickness of the material layer.

BRIEF DESCRIPTION OF THE DRAWINGS

Embodiments of inventive concepts will be more clearly understood from the following detailed description taken in conjunction with the accompanying drawings in which.

DETAILED DESCRIPTION OF EXAMPLE EMBODIMENTS

Hereinafter, some example embodiments will be described in detail with reference to the accompanying drawings. Like numeral references refer to like elements, and their repetitive descriptions are omitted.

Figure 1:
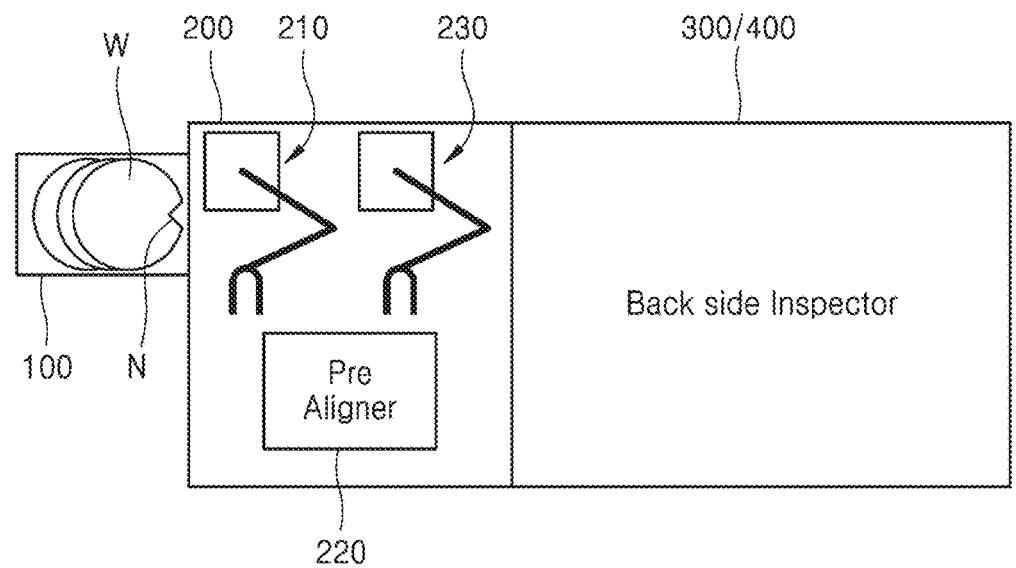
FIG. 1 is a diagram for describing a wafer inspection device according to some example embodiments.

FIG. 1 is a diagram of a wafer inspection device 10 according to some example embodiments.

Referring to FIG. 1, a wafer inspection hardware/wafer inspection device 10 may include a load port 100, an equipment front end hardware/module 200, and a plurality of back side inspectors/back side inspection hardware 300 and 400.

A before-inspection wafer W or a wafer cassette/wafer Front Opening Unit Pod (FOUP), where the before-inspection wafer W is kept, may be loaded to the load port 100. The wafer cassette/wafer FOUP may include a plurality of wafers, or, alternatively, a single wafer.

The wafer W may be a substrate/wafer W upon which various processes have been performed. The wafer W may include, for example, silicon (Si). The wafer W may include a semiconductor element, such as at least one of germanium (Ge), or a compound semiconductor such as silicon carbide (SiC), gallium arsenide (GaAs), indium arsenide (InAs), or indium phosphide (InP). The wafer W may further be or include a Silicon-On-Insulator (SOI) wafer, such as a Silicon-On-Sapphire (SOS) wafer.

Here, a back surface of the wafer W may be/correspond to a surface facing a chuck 311 (see FIG. 2) among both surfaces of the wafer W disposed on the chuck 311 (see FIG. 2), and a front surface of the wafer W may be an opposite surface of the back surface. The front surface may have various electrical components, such as at least one of resistors, transistors, capacitors, metal wirings, etc. fabricated on the wafer W; however, example embodiments are not limited thereto.

According to some example embodiments, the wafer W may have a silicon on insulator (SOI) structure. The wafer W may include a buried oxide layer formed on the front surface of the wafer W. According to some example embodiments, the wafer W may include a conductive region (for example, an impurity-doped well) formed in the front surface of the wafer W. According to some example embodiments, the wafer W may have various isolation structures such as shallow trench isolation (STI) isolating the impurity-doped well. Although not shown, a plurality of material layers may be formed in the front surface of the wafer W. At least one material layer may be formed in the back surface of the wafer W. A diameter of the wafer W may be 300 mm; however, example embodiments are not limited thereto. For example, the diameter of the wafer W may be 150 mm, or may be 200 mm, or may be 450 mm.

The wafer W may be for manufacturing one of a memory device and/or a non-memory device. According to some example embodiments, the memory device may include a non-volatile NAND flash memory. According to some example embodiments, the memory device may include phase change random access memory (PRAM), magnetic random access memory (MRAM), resistance random access memory (ReRAM), ferroelectric random access memory (FRAM), NOR flash memory, etc. Additionally or alternatively, the memory device may be a volatile memory device where data is lost when power is cut off, like dynamic random access memory (DRAM) and static random access memory (SRAM). According to some example embodiments, the memory device may be or include a logic chip, a measurement device, a communication device, a digital signal processor (DSP), and/or a system-on-chip (SoC).

According to some example embodiments, the wafer W may be a wafer on which a series of semiconductor device manufacturing process is completed. According to some example embodiments, the wafer W may be a wafer that is fabricated up to immediately before an assembly process, with the assembly process including dicing and packaging is performed, but is not limited thereto. For example, an additional semiconductor device manufacturing process such as chemical-mechanical polishing (CMP), chemical vapor deposition (CVD), atomic layer deposition (ALD), and lithography may be performed after the wafer W is inspected by the wafer inspection device 100.

The wafer W may include a notch N for identifying a direction of the wafer W. Depending on a case, the wafer W may include an arbitrary shape, such as a D-cut shape as well as a notch shape, for identifying a direction and/or orientation. According to some example embodiments, the wafer W may further include an additional indicator for indicating a dopant type of the wafer W, e.g., indicating whether the wafer W is lightly doped with N-type or P-type dopants. Alternatively or additionally, the wafer W may include a flat portion (not shown). The notch N may be associated with a crystal orientation of the semiconductor material include in the wafer W; however, example embodiments are not limited thereto The equipment front end module 200 may transfer and align the wafer W unloaded from the load port 100, thereby preparing for inspection of the wafer W. The equipment front end module 200 may include first and second transfer robots 210 and 230 for transferring a plurality of wafers W. The first and second transfer robots 210 and 230 may each include one or more mechanical/and/or robot arms which transfer the wafers W to the back side inspectors 300 and 400 and retrieve the wafers W from the back side inspectors 300 and 400. The robot arms may each include an end effector for fixing the wafers W during transfer. The end effector, for example, may be configured to pick up, hold, transfer, retrieve, and discharge the wafer W by applying a vacuum force to the wafer W and stopping the application of the vacuum force. The equipment front end module 200 may be powered by electricity and/or hydraulics; however, example embodiments are not limited thereto.

The equipment front end module 200 may further include a pre-aligning hardware/pre-aligner 220 for aligning a rotational direction (for example, a direction indicated by the notch N of the wafer W) of the wafer W before the wafer W is transferred to the back side inspector. The wafer W may be transferred by the first transfer robot 210, aligned by the pre-aligner 220, and loaded to the back side inspector 300 by the second transfer robot 230, but inventive concepts are not limited thereto. For example, the equipment front end module 200 may include a single transfer robot, unload the wafer W from the load port 100, provide the unloaded wafer W to the pre-aligner 220, and provide the back side inspector 300 with the wafer W where a direction thereof is aligned by the pre-aligner 220. The pre-aligner 220, for example, may rotate and align the wafer W so that a notch N of the wafer W faces one end of a slit SL (see FIG. 3) of a chuck 311 (see FIG. 3). The pre-aligner 220, for example, may rotate and align the wafer W so that the notch N of the wafer W forms an arbitrary angle with respect to the slit SL (see FIG. 3) of the chuck 311 (see FIG. 3).

The back side inspector 300 may inspect the back surface of the wafer W. The back side inspector 300 may be or include at least one of a spectroscopic reflectometer or a spectroscopic ellipsometer. Spectroscopic reflectometry and spectral ellipsometry may be optical technologies for inspecting structural characteristics, such as a thickness of a thin film and/or a line width of a pattern formed in the thin film, and/or dielectric characteristics such as a complex refractive index and/or a dielectric function. The back side inspector 300 may characterize at least one of the composition, roughness, thickness, depth, crystalline characteristic, doping concentration, electrical conductivity, or the like of each of a plurality of material layers formed in a back surface of an inspection target wafer W by using at least one of the spectroscopic reflectometry and the spectral ellipsometry.

Most material layers may have a polarization rotation symmetric characteristic corresponding to vertically incident light, and the spectroscopic reflectometry may allow light to be vertically incident on a film, thereby ignoring a polarization effect. Therefore, spectroscopic reflectometry may not need/use/require a complicated optical element such as a polarizer and/or an analyzer which are need/used to be continuously rotated, and thus, may be implemented at low cost and/or may be miniaturized. Additionally or alternatively, a spectroscopic photometer may increase power of incident light, and thus, may more easily perform reflectance analysis and/or transmittance analysis.

Spectral ellipsometry may use obliquely incident light, and thus, may analyze a polarization variation and/or strength of reflected light. Spectral ellipsometry may more easily measure a plurality of material layers, which are very thin (e.g. less than or equal to about 2000 Angstroms), and may be complicated, e.g. may more easily measure than spectroscopic reflectometry. Spectroscopic reflectometry may include a polarizer and/or an analyzer, for inspecting an amplitude ratio and a phase difference of after-reflection reflected light, and thus, may need an optical element, which is expensive and moves precisely.

The back side inspector 300 may irradiate light onto the wafer W and may measure a reflectance. The irradiated light may have a wide wavelength band. By the irradiation of light, the back side inspector 300 may calculate the kind and/or thickness of each of material layers formed in the back surface of the wafer W.

Generally, it may be difficult to directly obtain optical constants, such as the thickness and/or refractive index of each material layer, through an optical measurement performed by spectroscopic reflectometry and/or spectral ellipsometry. Therefore, model analysis for obtaining the optical constants may be further performed. Examples of the model may include a Forouhi Bloomer model. The model may be based on physical energy transfer and/or may be based on free parameters for data fitting. The model may include an order, in which layers formed on a back surface of the inspection target wafer W are stacked, along with the refractive index (and/or a dielectric function tensor) and thickness parameter of each of individual layers.

Spectroscopic reflectometry may calculate a reflectance through iteration (for example, through least square technique) for changing an optical constant and/or a thickness parameter, and spectral ellipsometry may calculate a reflection amplitude ratio and a phase difference by using an iteration (for example, through a least square technique) for changing an optical constant and/or a thickness parameter. Such calculations may use, for example, a Fresnel equation.

In spectroscopic reflectometry, when a spectroscopic reflectance calculated from a model through a series of iteration operations matches measurement values, the optical constant and/or thickness value of each of material layers used for the model may be determined as the optical constant and/or thickness value of each of material layers included in the wafer W. Likewise, in the spectroscopic ellipsometry, when a reflection amplitude ratio and/or a phase difference value calculated from a model through a series of iteration operations matches measurement values, the optical constant and/or thickness value of each of material layers used for the model may be determined as the optical constant and/or thickness value of each of material layers included in the wafer W.

Figure 2:
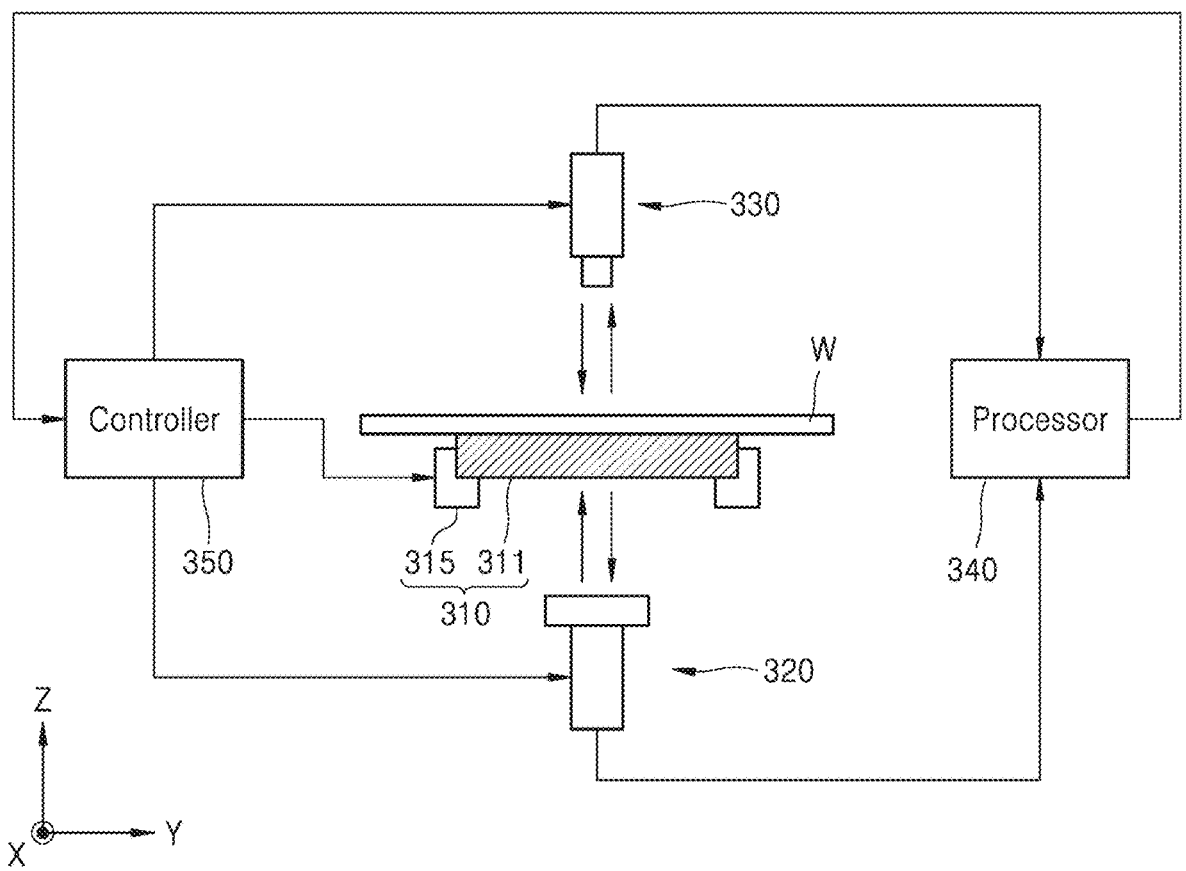
FIG. 2 is a diagram for describing a back side inspector according to some example embodiments.

FIG. 2 is a diagram of a back side inspector 300 according to some example embodiments.

Figure 3:
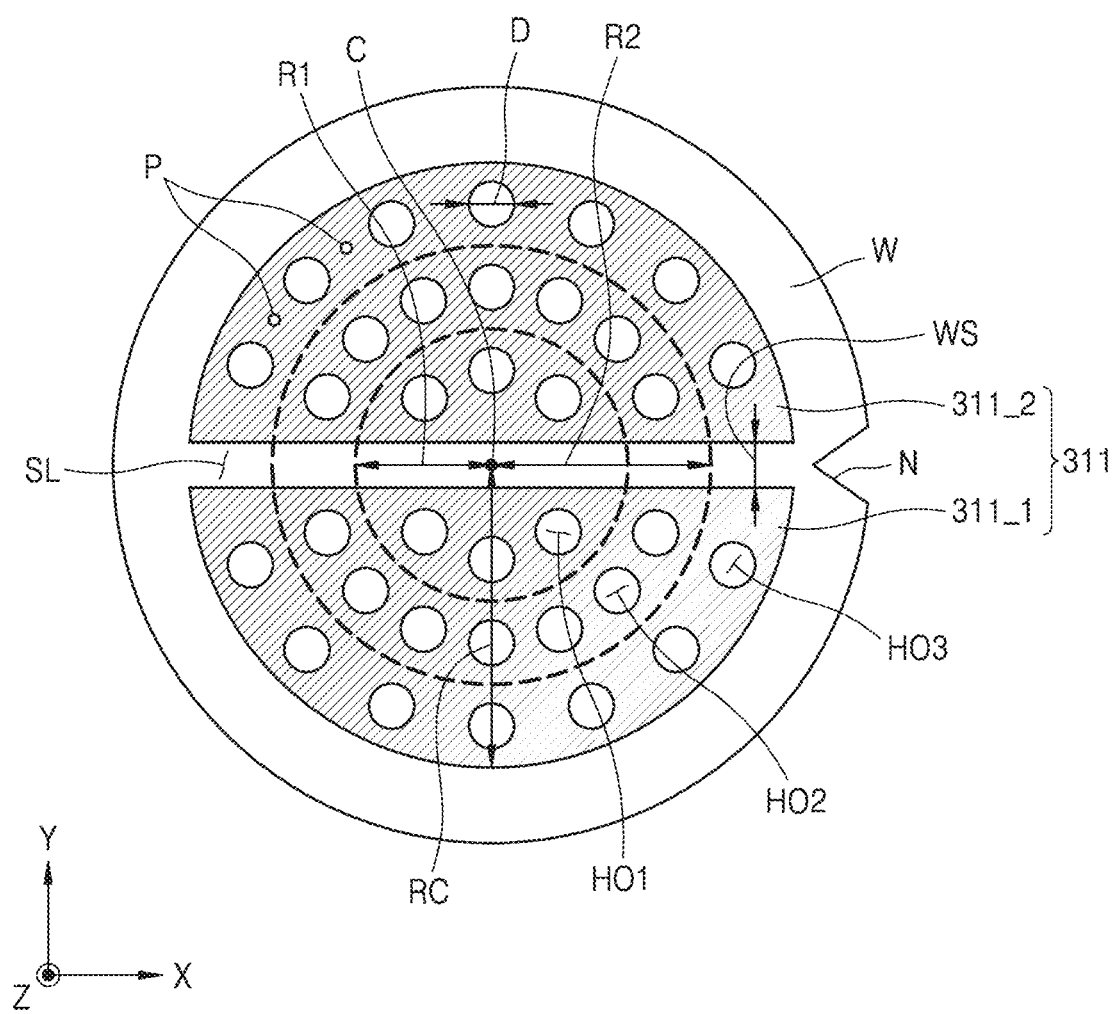
FIG. 3 is a plan view for describing a chuck included in a back side inspector according to some example embodiments.

FIG. 3 is a top view for describing a chuck 311 included in the back side inspector 300 according to some example embodiments.

Referring to FIGS. 2 and 3, the back side inspector 300 may include a stage 310, a back side inspection optical hardware/back side inspection optical system 320, a position determination optical hardware/position determination optical system 330, a processor 340, and a controller 350.

The stage 310 may be a space with an inspection target wafer W mounted therein. The stage 310 may include the chuck 311 and a chuck driving device 315.

The chuck 311 may be a platen and/or some mechanism for supporting and fixing a wafer W which is to be inspected. According to some example embodiments, the chuck 311 may be or include a vacuum chuck which fixes the wafer W by using pressure. The chuck 311 may be composed of one of carbon in a glass phase, or ceramic such as alumina, but example embodiments are not limited thereto.

The chuck 311 may include a porous material wherein a plurality of pores P are formed. The pores may be uniformly and/or randomly formed all over the chuck 311. A size of each of the pores formed in the chuck 311 may be within a range of about 10 μm to 100 μm, but example embodiments are not limited thereto. The size of each of the pores may have a distribution, e.g. a normal distribution or a uniform distribution. The chuck 311 may apply vacuum pressure to the wafer W through the pores. The vacuum pressure may be achieved via a pump (not illustrated). According to some example embodiments, the wafer W may be adhered to the chuck 311 by the vacuum pressure, and thus, bending of the wafer W may be reduced, thereby enhancing inspection reliability. The chuck 311 may have a porosity having a different range on the basis of a size/diameter of the wafer W which is fixed. However, inventive concepts is not limited thereto, and depending on the case, the chuck 311 may be or include an electrostatic chuck.

The chuck 311 may include at least one slit SL, along with a plurality of holes HO1 to HO3. The slit SL and the plurality of holes HO1 to HO3 may expose a portion of a back surface of the wafer W. Hereinafter, two orthogonal directions parallel to a top surface of a chuck may be defined as an X direction and a Y direction, and a direction vertical to the top surface of the chuck may be defined as a Z direction.

As seen from above, each of the plurality of holes HO1 to HO3 may be approximately circular in shape. However, inventive concepts are not limited thereto, and each of the plurality of holes HO1 to HO3 may have various shapes such a square shape, a triangular shape, and a cross shape. The plurality of holes HO1 to HO3 may be uniformly and/or randomly formed in the chuck 311. The plurality of holes HO1, HO2, and HO3 may be for inspecting the back surface of the wafer W, and the vacuum pressure for fixing the wafer is not applied to the wafer W through the plurality of holes HO1, HO2, HO3. The vacuum pressure for fixing the wafer W may be applied through the plurality of pores P.

The plurality of holes HO1 to HO3 may be disposed to be radially symmetrical with respect to a center C of the chuck 311. In some non-limiting example embodiment, six to eight first holes HO1 may be disposed within a first radius R1 from the center C of the chuck 311, ten to thirty second holes HO2 may be disposed between the first radius R1 and the second radius R2, and ten to thirty holes HO3 may be disposed outside the second radius R2. The second radius R2 may be greater than the first radius R1. In some non-limiting example embodiment, the first radius R1 may be about 4 inches (about 10 cm), and the second radius R2 may be about 8 inches (about 20 cm).

The plurality of holes HO1 to HO3 may have a diameter which is far greater than that of each of the plurality of pores P of the chuck 311 used to fix the wafer W to the chuck 311. According to some example embodiments, a diameter D of each of the plurality of holes HO1 to HO3 may be large enough such that interference caused by a sidewall of each of the plurality of holes HO1 to HO3 does not affect inspection of the back side inspection optical system 320. In some example non-limiting embodiments, the diameter D of each of the plurality of holes HO1 to HO3 may be within a range of about 7 mm to about 10 mm.

According to some example embodiments, a radius RC of the chuck 311 may be less than that of the wafer W. Therefore, the chuck 311 may be exposed at a ring-shaped edge portion of the wafer W, with the wafer w overhanging the chuck 311, and the back side inspection optical system 320 may inspect a rear edge portion of the wafer W.

The slit SL may have a linear/line shape which extends long in a direction such as an X direction. In some non-limiting example embodiments, the slit SL may extend to cross the center C of the chuck 311. The slit SL may extend along a diameter of the chuck 311. Therefore, the chuck 311 may be divided into first and second portions 311_1 and 311_2, which are divided apart from each other with the slit SL therebetween. According to some example embodiments, a width WS of the slit SL may be large enough such that optical interference caused by a sidewall of the slit SL does not affect inspection of the back side inspection optical system 320. According to some example embodiments, the width WS of the slit SL may be substantially the same as the diameter D of each of the plurality of holes HO1 to HO3. In some non-limiting example embodiments, the width WS of the slit SL may be within a range of about 7 mm to about 10 mm A sum of horizontal areas of the slit SL and each of the plurality of holes HO1 to HO3 may be equal to or less than a sum of horizontal areas of the first and second portions 311_1 and 311_2.

The arrangement and/ir dimensions of the slit SL and the plurality of holes HO1 to HO3 described above are merely an example and are not limited thereto. Also, in the arrangement of the plurality of holes HO1 to HO3, the chuck 311 for fixing a wafer W has a diameter of about 12 inches, or about 300 mm. However, based on description herein, those of ordinary skill in the art may easily implement a chuck which includes a plurality of holes and a slot suitable for inspection of a wafer having, for example, various radiuses of 6 inches (150 mm) and 8 inches (200 mm).

According to some example embodiments, the back side inspection optical system 320 may be a spectroscopic reflectometer. The back side inspection optical system 320 may include a vertical optical system which includes a light source and a sensor. According to some example embodiments, the light source may emit light of a specific (or, alternatively, predetermined) wavelength band (for example, about 300 nm to about 1200 nm). According to some example embodiments, the sensor may include at least one of a complementary metal-oxide-semiconductor (CMOS) image sensor or a charge-coupled device (CCD) camera. The back side inspection optical system 320 may irradiate light of a specific/predetermined wavelength band to measure a reflectance, thereby measuring a spectroscopic reflectance. According to some example embodiments, a cross-sectional surface of light, e.g. a spot-size of light, used for inspection of the back side inspection optical system 320 may be a circular or oval region having a diameter of about 2 mm, but example embodiments not limited thereto. According to some example embodiments, a region, on which beam used for inspection of the back side inspection optical system 320 is irradiated, of a back surface of the wafer W may be a circular region having a diameter of about 2 mm or oval region with similar area, but μ example embodiments are not limited thereto.

The chuck 311 may be connected to the chuck driving device 315 for supporting and driving the chuck 311. According to some example embodiments, the chuck driving device 315 may move the chuck 311 in an X direction and/or a Y direction. Therefore, the back side inspection optical system 320 may sequentially inspect different portions of the back surface of the wafer W. Alternatively or additionally, the chuck driving device 315 may rotate about the center C of the chuck 311. The chuck driving device 315 may be a chuck driving robot, and/or may include a motor and/or an actuator that are configured to move the chuck 311 in the X direction and/or the Y direction, and/or to rotate about the center C of the chuck 311. The chuck driving device 315 may be driven by electricity and/or by hydraulics.

Hereinafter, for convenience of description, example embodiments will be described where the chuck driving device 150 moves the chuck 311 to inspect different portions of the wafer W, while the back side inspection optical system 320 and the position determination optical system 330 are fixed. However, those of ordinary skill in the art may easily apply a below-described embodiment to an embodiment where the back side inspection optical system 320 and the position determination optical system 330 move to inspect different portions of the wafer W, while the chuck 311 is fixed.

The back side inspection optical system 320 may inspect portions of the wafer W exposed by the plurality of holes HO1 to HO3. According to some example embodiments, the chuck driving device 315 may move the chuck 311 so that a field of view (FOV) of the back side inspection optical system 320 is aligned at one end of the back surface of the wafer W exposed by the slit SL. The chuck driving device 315 may move the chuck 311 so that the back side inspection optical system 320 scans the back surface of the wafer W up to the other end of the slit SL from one end of the slit SL in the X direction. The chuck driving device 315 may rotate the chuck 311 and/or may move the chuck 311 in a horizontal direction, so that the back side inspection optical system 320 inspects an exposed ring-shaped edge portion of the wafer W.

The position determination optical system 330 may be aligned with the back side inspection optical system 320 in the Z direction. The position determination optical system 330 may identify a position of a portion inspected by the back side inspection optical system 320. Depending on the case, the position determination optical system 330 may not be included in the back side inspector 300.

The processor 340 may determine a thickness of each of a plurality of material layers formed in the back surface of the wafer W on the basis of a result of inspection by the position determination optical system 330 and/or the back side inspection optical system 320. The processor 340 may correct a result of measurement by the position determination optical system 330. The processor 340 may correct a misalignment value of the wafer W with respect to the chuck 311 and a misalignment value of the chuck 311 with respect to the back side inspection optical system 320.

The processor 340 may calculate a reflectance through iteration (for example, least square technique) for changing an optical constant and/or a thickness parameter. The iteration may be based on at least one of the known stacked order, optical constants (for example, a refractive index or a dielectric function tensor), and thickness parameters of the material layers formed in the back surface of the wafer W. When a calculated reflectance value matches experimental data, the processor 340 may determine the optical constants and/or thickness values of material layers, corresponding thereto, as the optical constants and/or thicknesses of the material layers included in the wafer W.

The processor 340 may determine the optical constants and/or thicknesses of the material layers formed in the back surface of the wafer W on the basis of positions (for example, positions exposed by the plurality of holes HO1 to HO3) determined by the position determination optical system 330. The processor 340 may map the position-based optical constants and thicknesses of the material layers to a front surface of the wafer W on the basis of the position-based optical constants and thicknesses of the material layers formed in the wafer W.

The controller 350 may generate a signal for controlling overall operations of active elements of the back side inspector 300. The controller 350 may control the bidirectional movement of the chuck 311 by the chuck driving device 315. The controller 350 may control a characteristic (for example, a wavelength) of light emitted from the light source of the back side inspection optical system 320. The controller 350 may control generating of a signal based on the sensor of the back side inspection optical system 320. The controller 350 may control processing by the processor 340

According to some example embodiments, either or both of the processor 340 and the controller 350 may each be a computing device such as a workstation computer, a desktop computer, a laptop computer, or a tablet computer. The processor 340 and the controller 350 may each be a simple controller, a microprocessor, a central processing unit (CPU), a complicated processor such as a graphics processing unit (GPU), a processor configured with software, dedicated hardware, or dedicated firmware. The processor 340 and the controller 350 may each be implemented with a general-use computer or application specific hardware such as a digital signal processor (DSP), a field programmable gate array (FPGA), or an application specific integrated circuit (ASIC).

According to some example embodiments, operations of the processor 340 and the controller 350 may be implemented as instructions stored in a machine-readable medium capable of being read and executed by one or more processors. Here, the machine-readable medium may include an arbitrary mechanism for storing and/or transmitting information in the form readable by a machine (for example, a computing device). For example, the machine-readable medium may include read-only memory (ROM), random access memory (RAM), a magnetic disk storage medium, an optical storage medium, a flash memory device, an electrical, optical, acoustic, or other-type radio signal (for example, a carrier, an infrared signal, a digital signal, or the like), and other arbitrary signals. Either or both of the processor 340 and the controller 350 may be or include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The processor 340 and the controller 350 may include firmware, software, routines, and instructions for each performing the above-described arithmetic operations. For example, the processor 340 may be implemented with software which is configured to perform iteration for determining the thicknesses and dielectric constants of optical layers.

However, this is for convenience of description, and the operations of the processor 340 and the controller 350 described above may be based on a computing device, a processor, a controller, or another device for executing firmware, software, routines, instructions, etc.

Figure 4:
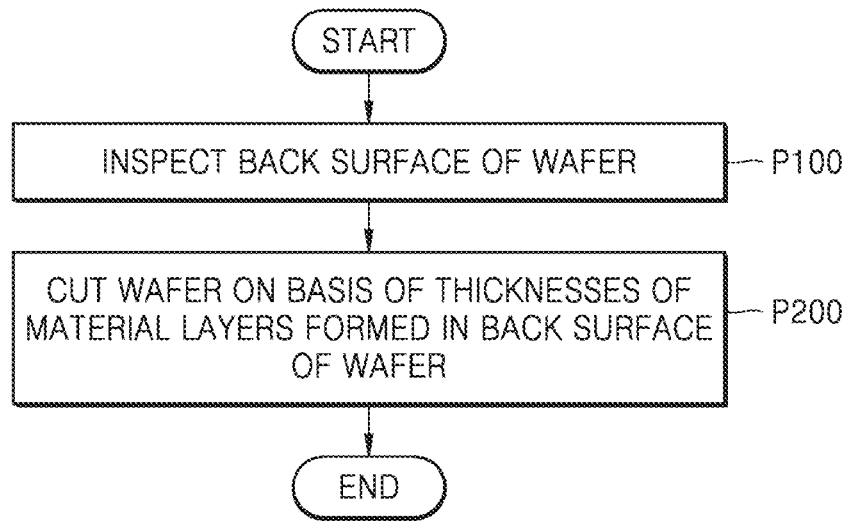
FIGS. 4 and 5 are flowcharts for describing a method of manufacturing a semiconductor device, according to some example embodiments.
Figure 5:
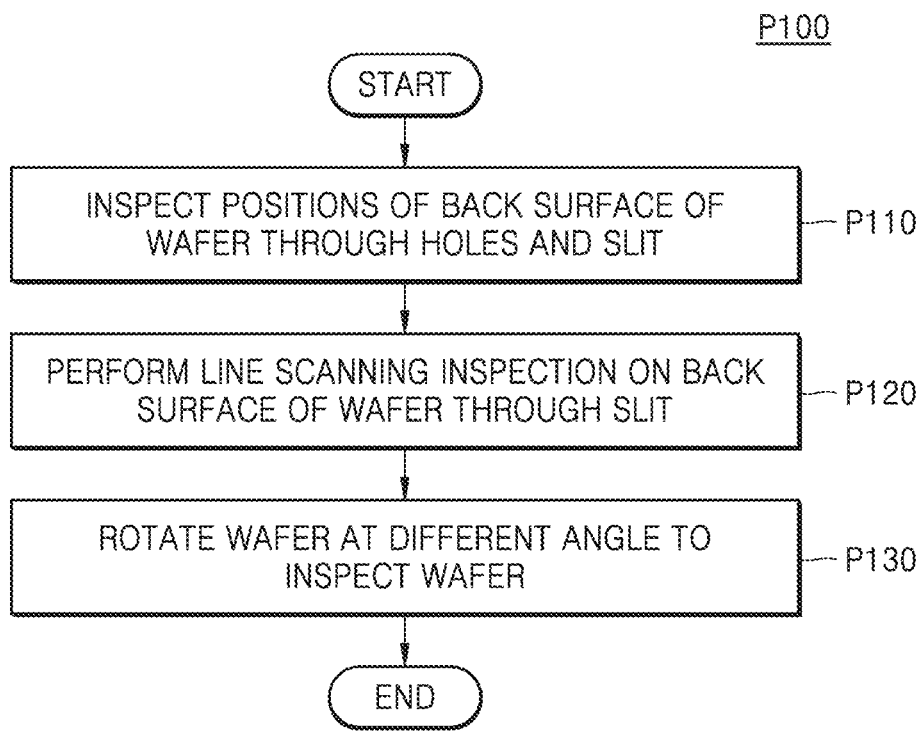

FIGS. 4 and 5 are flowcharts of a method of manufacturing a semiconductor device, according to some example embodiments.

Referring to FIG. 4, the method of manufacturing a semiconductor device may include a process of inspecting a back surface of a wafer in operation P100 and a process of cutting the wafer on the basis of a thickness of a layer formed in the back surface of the wafer in operation P200.

In the cutting process, the wafer, e.g. the wafer W, may be cut along a scribe lane/kerf lane, which is a region for dividing chips, and thus, may be isolated into individual chips. According to some example embodiments, cutting of the wafer may be performed through stealth dicing. The stealth dicing may be or include technology which focuses a laser beam having a wavelength, passing through the wafer, on one internal portion of the wafer through a back surface of the wafer. In the stealth dicing, the laser beam may repeatedly irradiate the wafer, and may be in a form of pulse which is continued for a very short time and may focus on a narrow region of the wafer. Therefore, the laser beam may have a high output density spatially (through localization) and temporally (through pulsing) at a position near a specific/predetermined internal focal point of the wafer. A laser beam having a high maximum output density may cause a nonlinear absorption effect to a wafer near a focal point, and thus, a portion of the wafer around the focal point may absorb the laser beam. Therefore, a high-density potential may be generated at a portion, absorbing a laser beam, of a wafer, and thus, vertical cracks of the wafer may occur/more easily occur.

Referring to FIGS. 3 and 5, a process (P100) of inspecting the back surface of the wafer W may include a process (P110) of inspecting a plurality of positions of the back surface of the wafer W through the plurality of holes HO1 to HO3 and the slit SL on the basis of a spot inspection manner, a process (P120) of inspecting the back surface of the wafer W through the slit SL on the basis of a line scanning manner, and a process (P130) of additional inspection of the back surface of the wafer W by rotating the wafer W at a different angle.

Referring to FIGS. 2, 3, and 5, in operation P110, the back side inspector 300 may measure a spectroscopic reflectance of each of a plurality of positions of a wafer W. The plurality of positions may be or correspond to a plurality of regions which are uniformly distributed in the back surface of the wafer W, e.g. a majority of or the whole of the back surface of the wafer W. The plurality of positions may be radially symmetrical with respect to a center C of the wafer W, but example embodiments are not limited thereto.

A process of measuring the spectroscopic reflectance of each of the plurality of positions may include a process of determining a position correction value between the position determination optical system 330 and the chuck 311, a process (e.g., rotational alignment of the wafer W) of allowing a notch N of the wafer W to face a predetermined direction, and a process of determining a position correction value between the chuck 311 and the wafer W.

The processor 340 may perform alignment of the back side inspection optical system 320 and/or the position determination optical system 330 with respect to a center position of each of the plurality of holes HO1 to HO3 on which inspection is performed. Therefore, the processor 340 may calculate a position correction value between an FOV of the back side inspection optical system 320 and a center of one hole, which is inspected, among the plurality of holes HO1 to HO3. Before inspection is performed, the equipment front end module 200 (see FIG. 1) may rotate and/or align the wafer W. The wafer W may be loaded to the chuck 311, and then, a position correction value of the wafer W with respect to a center of each of the plurality of holes HO1 to HO3 may be calculated through alignment between the center of the wafer W and the position determination optical system 330.

The processor 340 may apply a correction value of the center of the wafer W and/or a correction value of the back side optical system 120 with respect to the center of each of the plurality of holes HO1 to HO3. The controller 350 may transfer a position correction signal based on the position correction value to the chuck driving device 315 to move the chuck 311. Therefore, the controllability of an inspection position of the back surface of the wafer W may be enhanced. Based on a spectroscopic reflectance value of each of the inspected positions of the wafer W in the chuck 311, the processor 340 may calculate thicknesses of material layers formed in the positions of the back surface of the wafer W.

Subsequently, in operation P120, the back side inspection optical system 320 may line-scan the back surface of the wafer W through the slit SL of the chuck 311 to measure a spectroscopic reflectance of a portion of the wafer W extending in an X direction. The processor 340 may calculate a variation of a thickness of a material layer formed in the back surface of the wafer W in the X direction on the basis of the measured spectroscopic reflectance. The back side inspector 300 according to some example embodiments may further calculate a height of a stepped structure of the back surface of the wafer W on the basis of thicknesses of material layers formed at a plurality of positions of the back surface of the wafer W.

Subsequently, in operation P130, the back side inspector 300 may rotate the wafer W and may perform a spot inspection operation on the wafer W aligned at a different angle through the plurality of holes HO1 to HO3 of the chuck 311 and/or may perform a wafer back surface line scanning inspection operation on the wafer W through the slit SL. For example, the wafer W may be mounted on the chuck 311 so that the notch N of the wafer W is initially aligned in the X direction and may be inspected. After the inspection, wafer W may be rotated such that the notch N of the wafer W has an angle of about 5 degrees to about 85 degrees with respect to the X direction and may be mounted on the chuck 311 again. Such a rotation may be performed by the pre-aligner 220 as described above but example embodiments are not limited thereto.

A process (P130) may be repeatedly performed so that the notch N of the wafer W forms various angles with respect to the slit SL. Therefore, the whole or a majority of the back surface of the wafer W may be inspected, and a thickness of a material layer formed all over the back surface of the wafer W may be measured.

According to some example embodiments, the inspections performed in operations P110 to P130 may be performed in an arbitrary order, and depending on the case, at least one inspection may be omitted. For example, only one of the spot inspection (P110), the line scanning inspection (P120), and the inspection (P130) performed on the whole back surface of the wafer W through a repetitive rotation may be performed. In another embodiment, one of the inspections (P110 to P130) may be omitted. In some example embodiments, the spot inspection (P110) may be performed after the line scanning inspection (P120) is performed.

When a thickness of a material layer formed in the back surface of the wafer W varies to have a value differing from a target value in a semiconductor manufacturing process, the reflectance and/or transmittance of the back surface of the wafer W may vary. The variations of the reflectance and/or transmittance of the back surface of the wafer W may cause defocusing of the laser beam in a process of cutting the wafer W by using the stealth laser, causing a chip defect in the process of cutting the wafer W. According to some example embodiments, a thickness of a material layer formed all over the back surface of the wafer W may be more precisely detected, and thus, defocusing of the laser beam may be prevented or reduced in likelihood of occurrence in the process of cutting the wafer W. Therefore, reliability may be enhanced in manufacturing a semiconductor device.

Figure 6A:
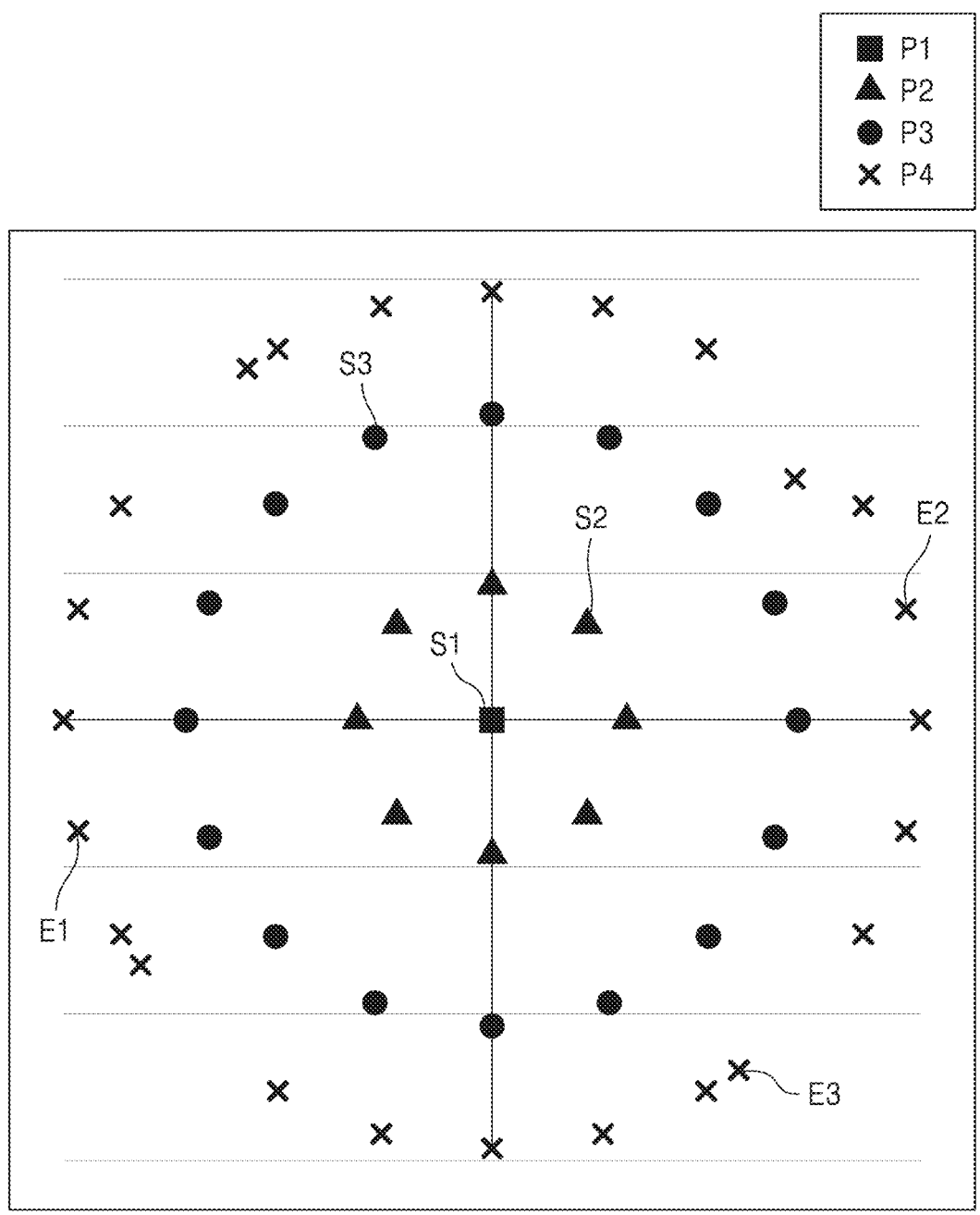
FIGS. 6A and 6B are diagrams for describing an effect of a wafer inspection device according to some example embodiments.
Figure 6B:
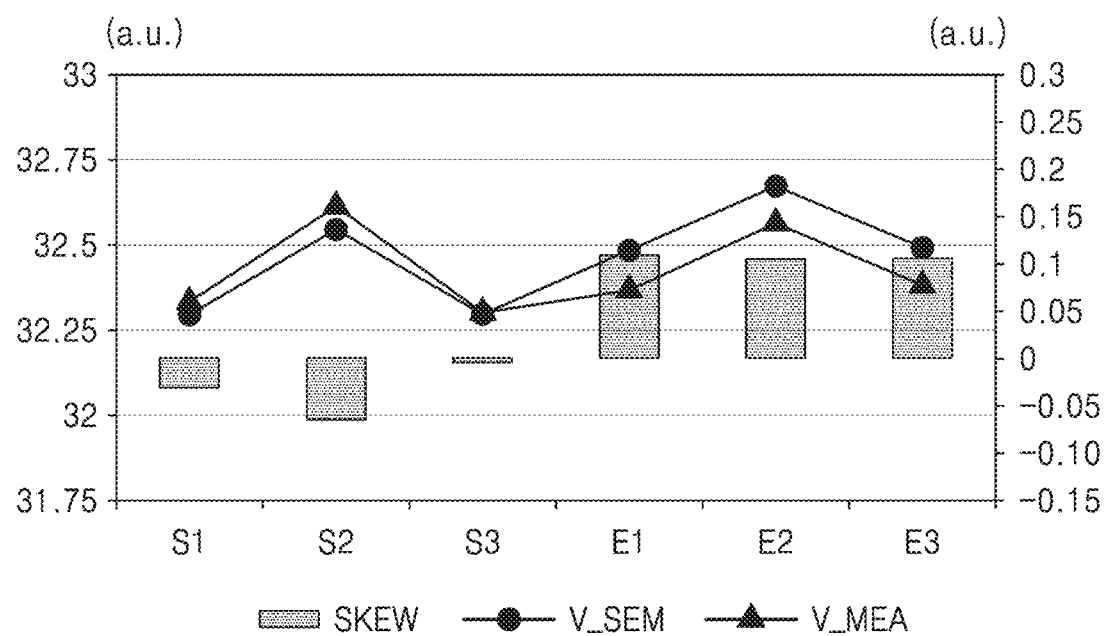

FIGS. 6A and 6B are diagrams for describing an effect of a wafer inspection device 10 (see FIG. 1) according to some example embodiments.

FIG. 6A illustrates a plurality of regions, on which measurement has been performed, of a back surface of a wafer W (see FIG. 2).

Referring to FIGS. 3 and 6A, P1 may refer to a center of the wafer W measured through the slit SL, P2 may refer to portions, measured through the slit SL and first holes HO1, within a first radius R1, P3 may refer to portions between the first radius R1 and a second radius R2 measured through the slit SL and second holes HO2, and P4 may refer to edge portions of the wafer W measured through the slit SL and third holes HO3.

FIG. 6B shows a result obtained by comparing a thickness V_MEA, calculated by the back side inspector 300 according to some example embodiments, with a thickness V_SEM measured by a scanning electron microscope (SEM) with respect to a thickness of a material layer formed at each of portions S1, S2, S3, E1, E2, and E3 of the wafer W of FIG. 6A.

In FIG. 6B, the ordinate axis of a left portion represents a scale corresponding to the thickness V_MEA calculated by the back side inspector 300 and a scale corresponding to the thickness V_MEA measured by the SEM, and the ordinate axis of a right portion represents a scale corresponding to skew which is a difference between the thickness V_MEA and the thickness V_MEA. Each of two ordinate axes is represented by an arbitrary unit (a.u.) standardized based on the same manner.

Referring to FIGS. 3, 6A, and 6B, S1 is selected as one portion from P1, S2 is selected as one portion from P2, S3 is selected as one portion from P3, and E1 to E3 are selected from P4.

Referring to FIG. 6B, an error between inspection by the back side inspector 300 (see FIG. 2) and inspection by the SEM is shown to be less than about 1% with respect to a back surface of a wafer according to some example embodiments, and thus, the inspections may be highly accurate. According to some example embodiments, a thickness of a material layer formed in a back surface of a wafer W (see FIG. 3) may be nondestructively calculated at high accuracy, and thus, reliability may be enhanced in manufacturing a semiconductor device.

FIGS. 7A to 7G are plan views for describing a structure of each of a plurality of chucks 311a, 311b, 311c, 311d, 311e, 311f, and 311g according to some other embodiments.

Figure 7A:
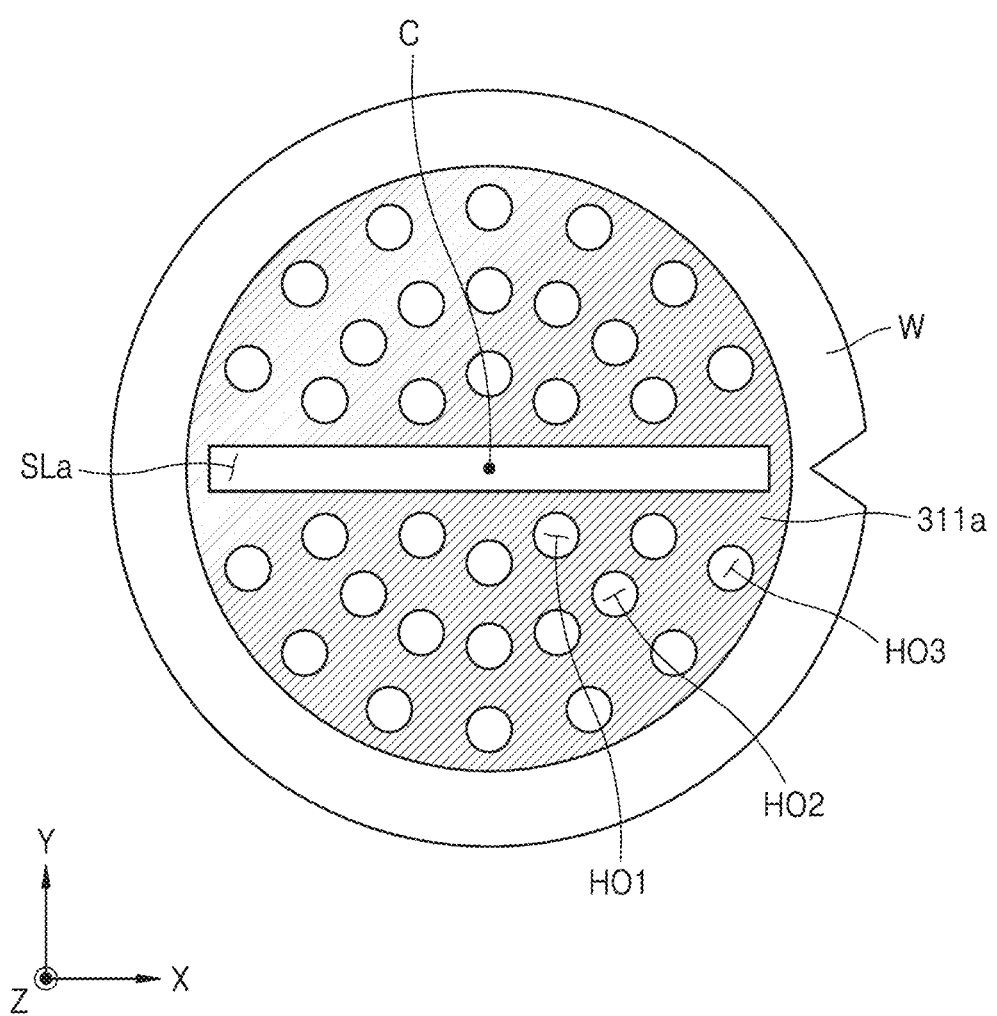
FIGS. 7A to 7G are plan views for describing a structure of each of a plurality of chucks according to some example embodiments.

Referring to FIG. 7A, the chuck 311a may include a slit SLa extending by a distance which is shorter than a diameter of the chuck 311a. A length of the slit SLa in an X direction may be approximately less than a radius of the chuck 311a. According to some example embodiments, the slit SLa may extend across a center C of the chuck 311a. Therefore, the chuck 311a may not be divided into a plurality of units and may be configured as a single unit.

Figure 7B:
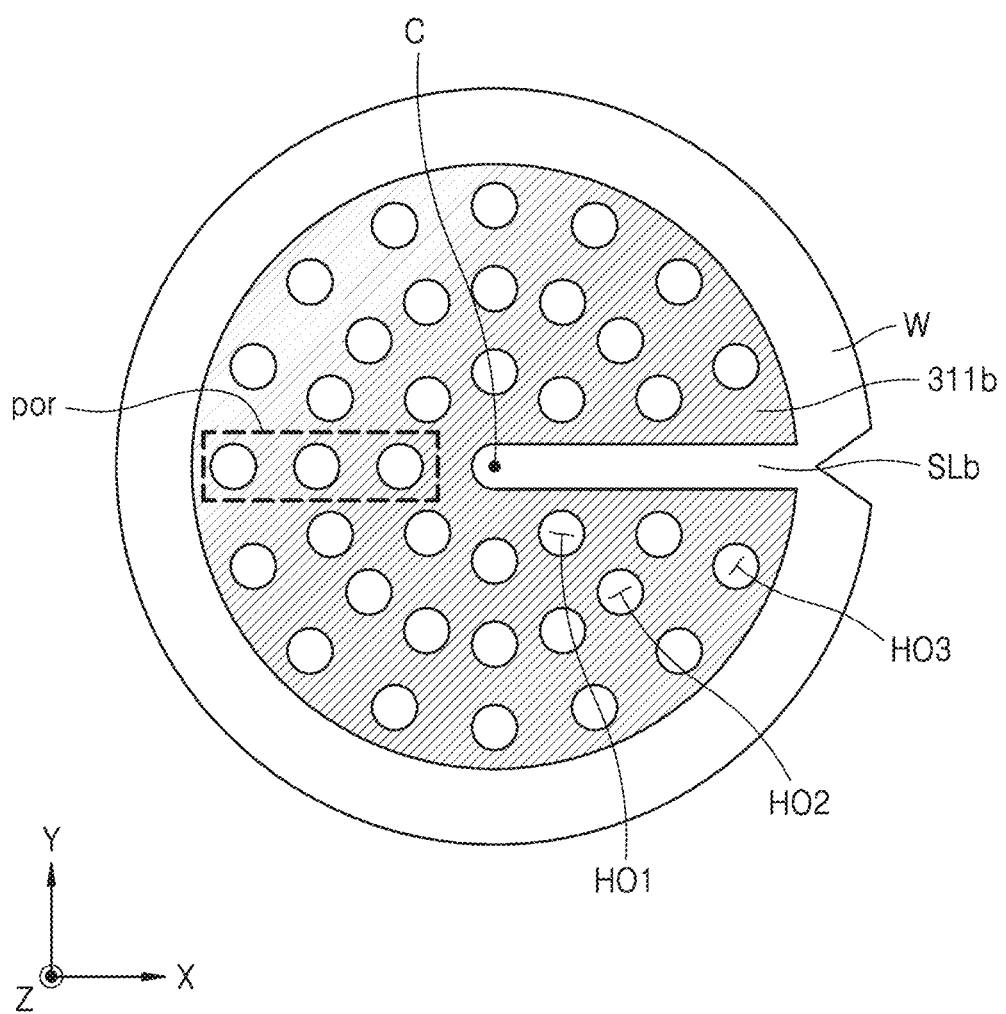

Referring to FIG. 7B, the chuck 311b may include a slit SLb extending by a distance which is shorter than a diameter of the chuck 311b. According to some example embodiments, the slit SLb may extend from a center C of the chuck 311b to an edge of the chuck 311b. A length of the slit SLb may be approximately equal to a radius of the chuck 311b. Therefore, the chuck 311b may not be divided and may be configured as a single unit. The chuck 311b of FIG. 7B may include a plurality of additional holes HO1 to HO3 formed in a portion to which the slit SLb does not extend.

Figure 7C:
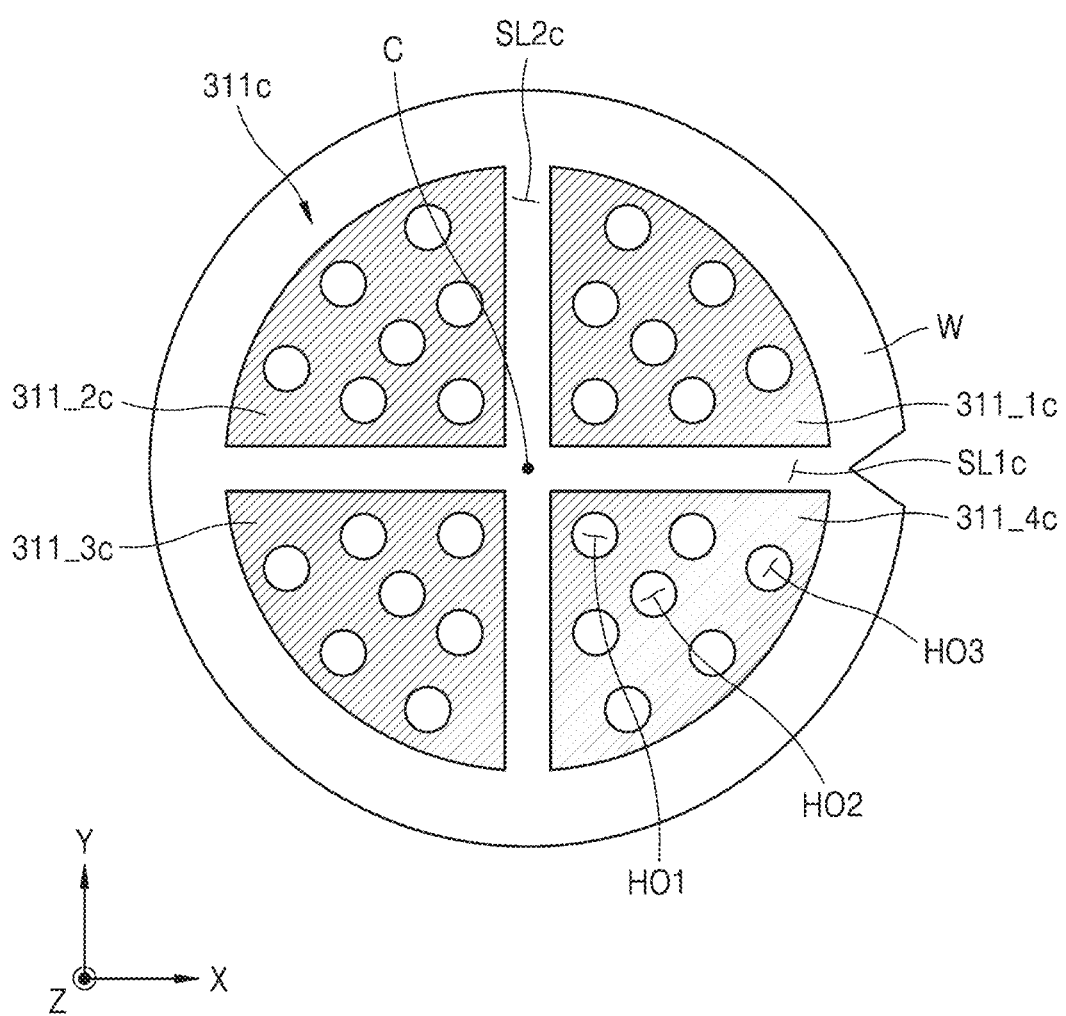

Referring to FIG. 7C, the chuck 311c may include first and second slits SL1c and SL2c intersecting with each other. According to some example embodiments, the first and second slits SL1c and SL2c may perpendicularly intersect with each other. The first and second slits SL1c and SL2c may pass through a center C of the chuck 311c to form a diameter of the chuck 311c and may respectively extend in an X direction and a Y direction. Therefore, the chuck 311c may include first to fourth units 311_1c, 311_2c, 311_3c, and 311_4c, which are horizontally apart from one another and each include a top surface having substantially the same shape.

Figure 7D:
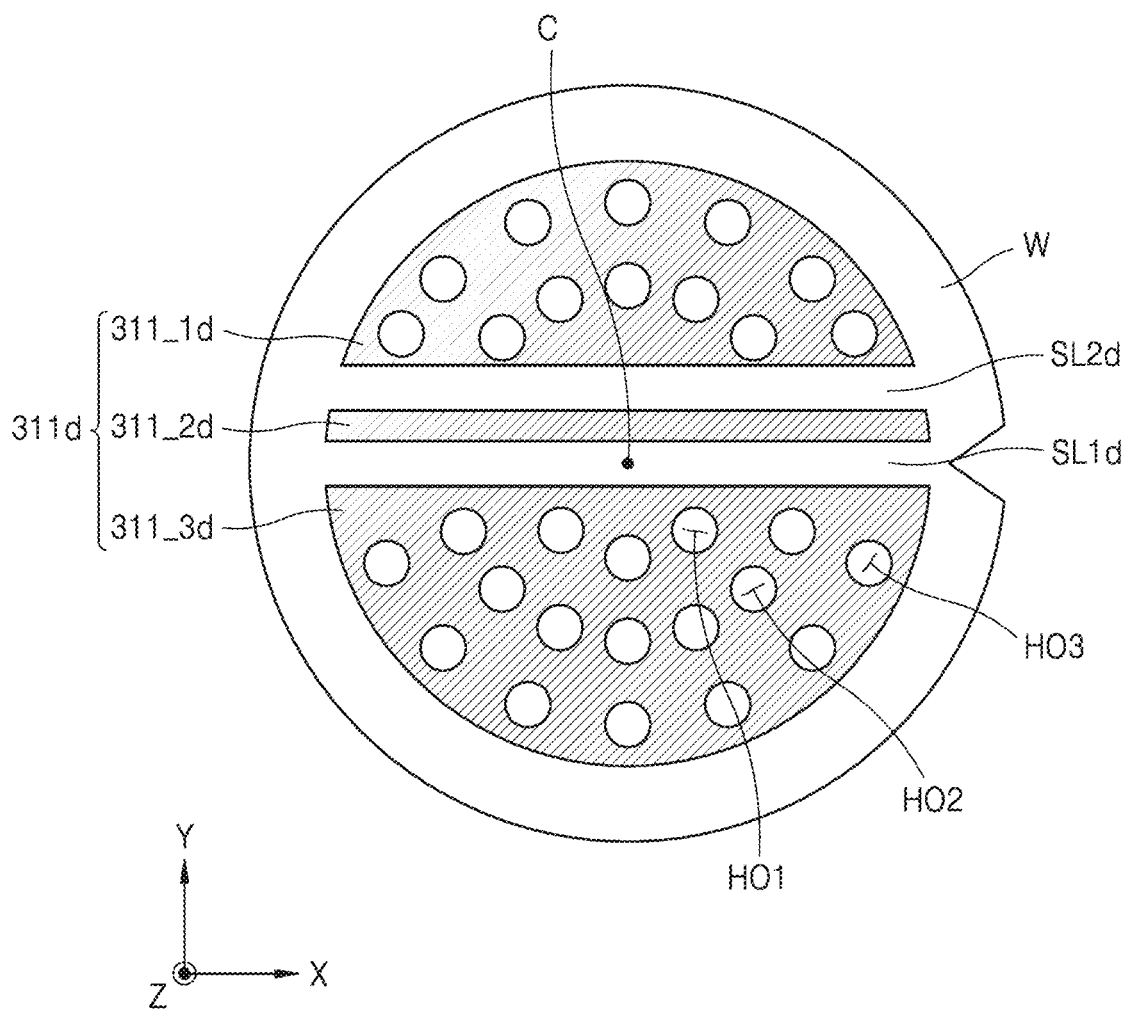

Referring to FIG. 7D, the chuck 311d may further include a first slit SL1d, which horizontally passes through the chuck 311d via a center C of the chuck 311d, and a second slit SL2d, which is apart from the center C of the chuck 311d and horizontally passes through the chuck 311d. Therefore, the chuck 311d may include first to third units 311_1d, 311_2d, and 311_3d having different shapes.

Figure 7E:
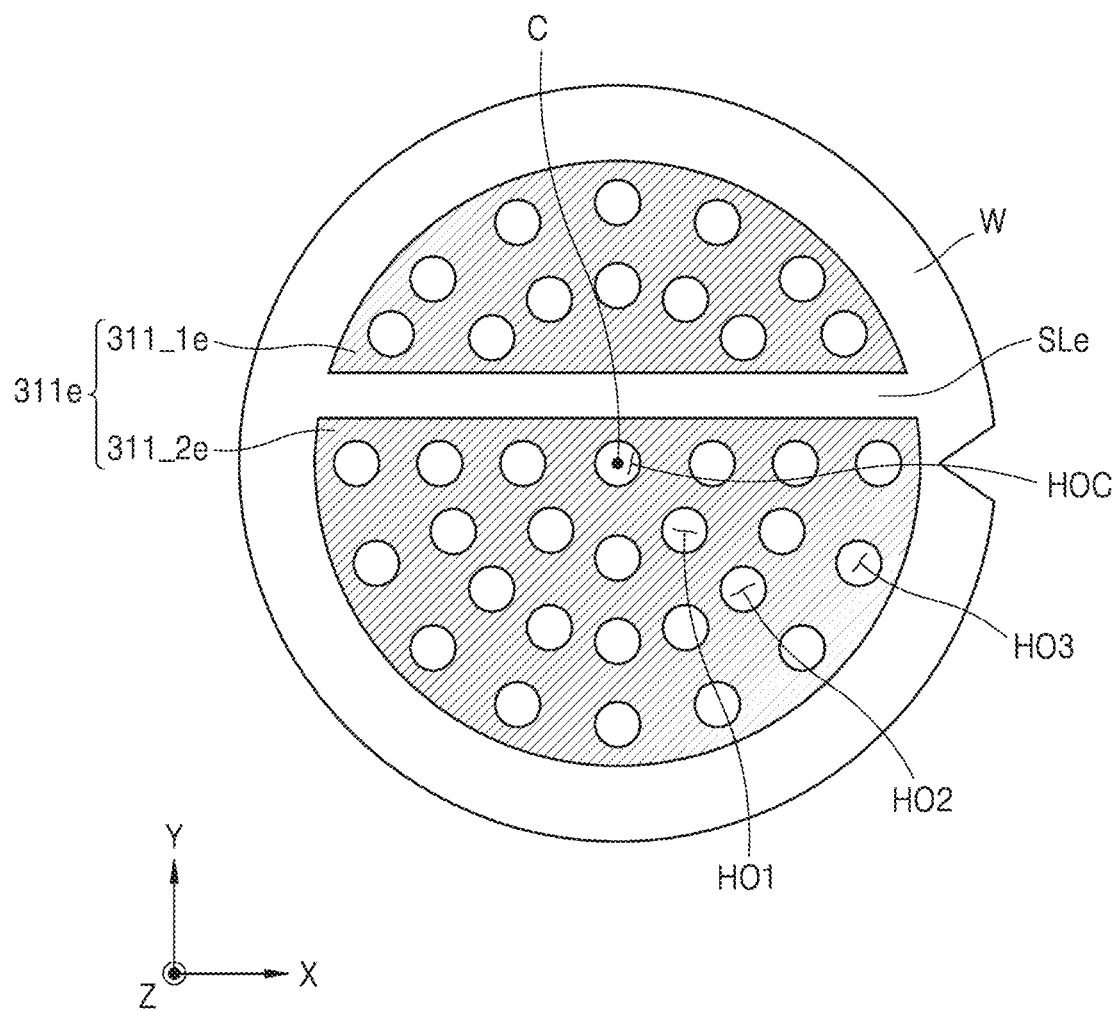

Referring to FIG. 7E, the chuck 311e may include a slit SLe, which is apart from a center C of the chuck 311e and horizontally passes through the chuck 311e. Therefore, the chuck 311e may include first and second units 311_1e and 311_2e having different shapes. Also, a center hole HOC may be further formed in the center C of the chuck 311e.

Figure 7F:
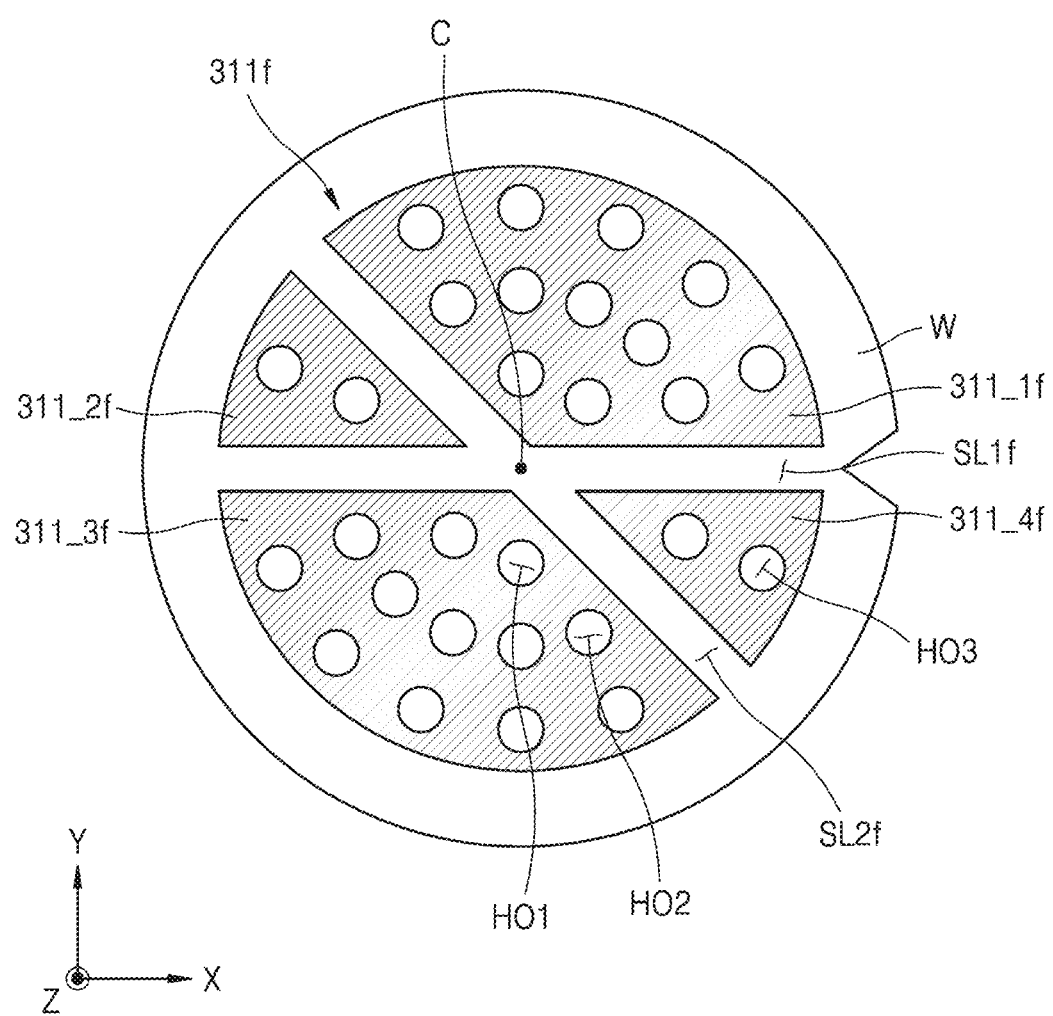

Referring to FIG. 7F, the chuck 311f may include first and second slits SL1f and SL2f intersecting with each other. According to some example embodiments, the first and second slits SL1f and SL2f may obliquely intersect with each other. The first and second slits SL1f and SL2f may pass through a center C of the chuck 311f and may extend along a diameter of the chuck 311f. Therefore, the chuck 311f may include first to fourth units 311_1f, 311_2f, 311_3f, and 311_4f, which are horizontally apart from one another and have different shapes.

Figure 7G:
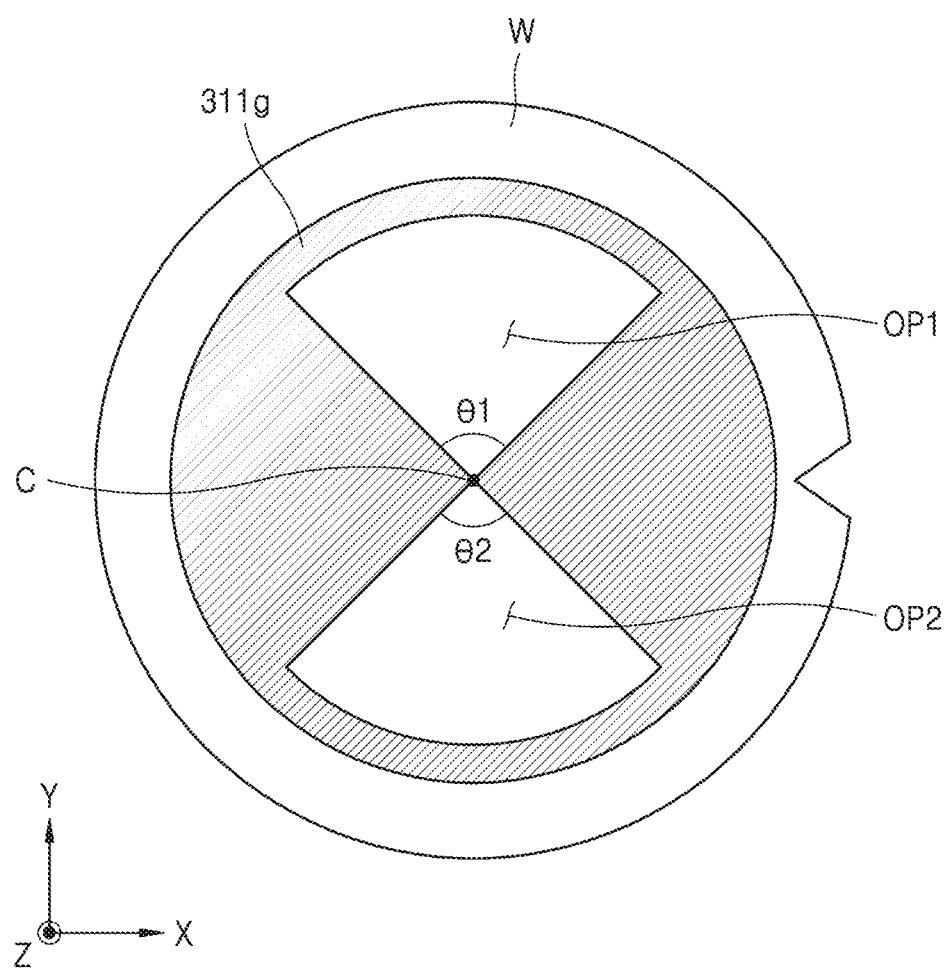

Referring to FIG. 7G, the chuck 311g may include first and second openings OP1 and OP2 having a fan shape. According to some example embodiments, the first and second openings OP1 and OP2 may define first and second center angles θ1 and θ2 with respect to a center C of the chuck 311g. Each of the first and second center angles θ1 and θ2 may be about 90 degrees but is not limited thereto. For example, the first and second center angles θ1 and θ2 may have various angles such as 30 degrees, 60 degrees, and 45 degrees.

In some non-limiting example embodiments, when each of the first and second center angles θ1 and θ2 is about 90 degrees, a notch N of a wafer W may be aligned at angles of 0 degrees and 90 degrees with respect to an X axis twice, and thus, a whole back surface of the wafer W may be inspected. In some example embodiments, when each of the first and second center angles θ1 and θ2 is about 60 degrees, the notch N of the wafer W may be aligned at angles of 0 degrees, 60 degrees, and 120 degrees with respect to the X axis three times, and thus, a majority of, or the whole back surface of the wafer W may be inspected.

Figure 8:
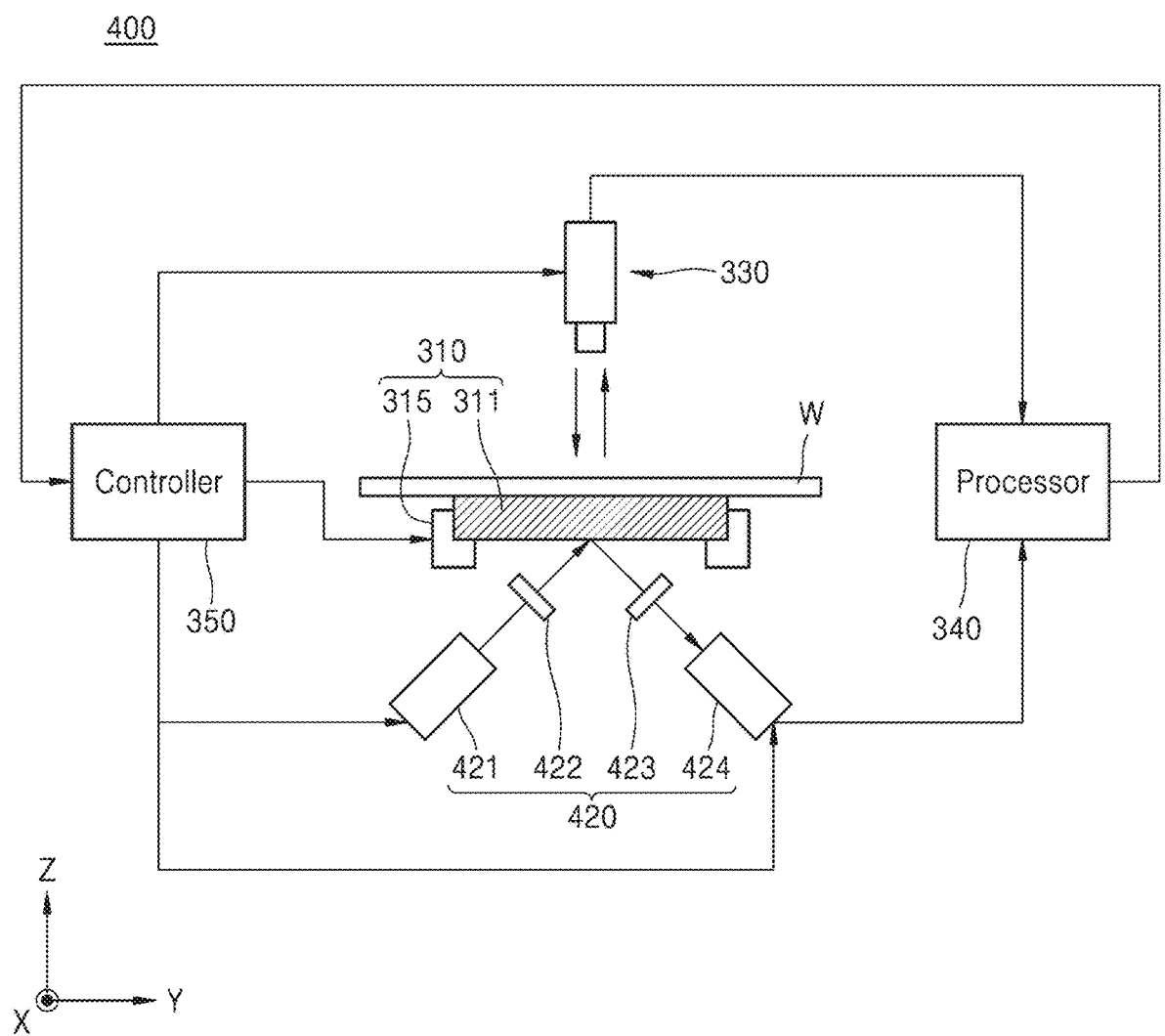
FIG. 8 is a diagram for describing a back side inspector according to some example embodiments.

FIG. 8 is a diagram of a back side inspector 400 according to some example embodiments.

For convenience of description, description which is the same as or similar to description given above with reference to FIGS. 2 and 3 is omitted, and a difference will be mainly described.

Referring to FIG. 8, the back side inspector 400 may include a stage 310, a back side inspection optical system 420, a position determination optical system 330, a processor 340, and a controller 350.

The back side inspection optical system 420 may include an inclined optical system. According to some example embodiments, the back side inspection optical system 420 may be a spectroscopic ellipsometer.

The back side inspection optical system 420 may include a light source 421, a polarizer 422, an analyzer 423, and a sensor 424. The light source 421 may emit light of a predetermined wavelength band (for example, about 300 nm to about 1200 nm). The polarizer 422 may linearly polarize the light emitted from the light source 421, and the analyzer 423 may rotate a polarization direction of light reflected to a back surface of a wafer W. The polarizer 422 and the analyzer 423 may be respectively connected to a plurality of rotation driving devices. The rotation driving devices may rotate the polarizer 422 and the analyzer 423 so that a polarization axis of the polarizer 422 and a polarization axis of the analyzer 423 are oriented at various angles. The sensor 424 may include one of a CMOS image sensor and a CCD camera.

The back side inspection optical system 420 may irradiate light of a specific (or, alternatively, pre-determined) wavelength band to measure a reflectance, thereby measuring an amplitude ratio and/or a phase difference between incident light and reflected light. An FOV of the back side inspection optical system 420 of FIG. 8 may be an oval region and may be greater than the FOV of the back side inspection optical system 320 of FIG. 2.

While inventive concepts has been particularly shown and described with reference to embodiments thereof, it will be understood that various changes in form and details may be made therein without departing from the spirit and scope of the following claims.

What is claimed is:

1. A wafer inspection device comprising:
    a porous chuck having a plurality of pores located all over the porous chuck, the plurality of pores enabling pressure for fixing a wafer to be applied to the porous chuck;
    a chuck driving actuator configured to drive the porous chuck;
    a back side inspection optical system under the porous chuck, the back side inspection optical system configured to inspect a portion of a back surface of the wafer; and
    a position identification optical system on the porous chuck, the position identification optical system configured to identify a position of the portion of the wafer inspected by the back side inspection optical system,
    wherein the porous chuck includes,
        a plurality of holes uniformly located all over the porous chuck, the plurality of holes configured to partially expose the back surface of the wafer; and
        a slit configured to expose the back surface of the wafer and extending in one direction parallel to a top surface of the porous chuck.

2. The wafer inspection device of claim 1, wherein the slit divides the porous chuck into a first portion and a second portion horizontally apart from the first portion.

3. The wafer inspection device of claim 1, wherein a radius of the porous chuck is less than a radius of the wafer.

4. The wafer inspection device of claim 1, wherein a width of the slit is between 7 mm and 10 mm.

5. The wafer inspection device of claim 1, wherein a diameter of each of the plurality of holes is 7 mm to 10 mm.

6. The wafer inspection device of claim 1, wherein a diameter of each of the plurality of pores is 10 μm to 100 μm.

7. The wafer inspection device of claim 1, wherein the plurality of holes are located to be radially symmetrical with one another.

8. The wafer inspection device of claim 7, wherein the plurality of holes comprise:
    a plurality of first holes radially symmetrical with one another at a same radius from a center of the porous chuck, the plurality of first holes within a first radius from the center of the porous chuck;
    a plurality of second holes radially symmetrical with one another at a same radius from the center of the porous chuck, the plurality of second holes between the first radius and a second radius; and
    a plurality of third holes radially symmetrical with one another at a same radius from the center of the porous chuck, the plurality of third holes outside the second radius,
    wherein the second radius is greater than the first radius.

9. The wafer inspection device of claim 1, wherein the back side inspection optical system includes a spectroscopic reflectometer.

10. The wafer inspection device of claim 1, wherein the back side inspection optical system includes a spectroscopic ellipsometer.

11. A wafer inspection device comprising:
    a chuck configured to fix a wafer by using vacuum pressure;
    a chuck driving actuator configured to drive the chuck;
    a back side inspection optical system under the chuck and configured to inspect a back surface of the wafer; and
    a position identification optical system on the chuck and configured to identify a position of a portion of the wafer inspected by the back side inspection optical system,
    wherein the chuck includes,
        a plurality of holes radially symmetrical with respect to a center of the chuck and configured to partially expose the back surface of the wafer, and
        a slit extending in one direction parallel to a top surface of the chuck, the slit crossing the center of the chuck and configured to expose the back surface of the wafer.

12. The wafer inspection device of claim 11, wherein the chuck driving actuator is configured to move the chuck in a horizontal direction so that the back side inspection optical system sequentially inspects different portions of the back surface of the wafer through the plurality of holes.

13. The wafer inspection device of claim 11, wherein the chuck driving actuator is configured to move the chuck in a horizontal direction so that the back side inspection optical system scans the back surface of the wafer along the slit.

14. The wafer inspection device of claim 11, wherein a radius of the chuck is less than a radius of the wafer, and the chuck driving actuator is configured to move the chuck in a horizontal direction to inspect an edge portion of the back surface of the wafer.

15. The wafer inspection device of claim 11, further comprising a processor configured to correct misalignment between the chuck and the wafer and misalignment between the chuck and the back side inspection optical system.

16. The wafer inspection device of claim 15, wherein the back side inspection optical system includes a spectroscopic reflectometer, and the processor is configured to map a thickness of a material layer formed in the back surface of the wafer in the whole back surface of the wafer on the basis of a result of the inspection by the back side inspection optical system.

17. A wafer inspection device comprising:
    a load port configured to load a cassette having a wafer in the cassette;
    a back side inspector hardware configured to inspect a back surface of the wafer; and
    an equipment front end hardware configured to transfer the wafer from the load port to the back side inspector hardware,
    wherein the equipment front end hardware includes,
        a transfer robot configured to transfer the wafer, and
        a pre-aligner hardware configured to rotate and align the wafer,
    wherein the back side inspector hardware includes,
        a chuck configured to support the wafer transferred from the cassette, the chuck including a porous material,
        a chuck driving actuator configured to drive the chuck, and
        a back side inspection optical system under the chuck, the back side inspection optical system configured to inspect the back surface of the wafer, and
    the chuck includes,
        a plurality of holes uniformly formed all over the back surface of the chuck to partially expose the back surface of the wafer, and
        a first slit extending in one direction parallel to a top surface of the chuck to expose the back surface of the wafer.

18. The wafer inspection device of claim 17, wherein the equipment front end hardware is configured to retrieve a wafer inspected by the back side inspection hardware, to rotate and align the wafer at a different angle, and to remount the wafer on the chuck of the back side inspector.

19. The wafer inspection device of claim 17, wherein the chuck further comprises a second slit extending in one direction parallel to the top surface of the chuck, the slit configured to expose the back surface of the wafer.

20. The wafer inspection device of claim 17, wherein a length of the first slit is substantially the same as a radius of the chuck.

\* \* \* \* \*